United States Patent
Weis et al.

(10) Patent No.: US 12,382,678 B2
(45) Date of Patent: Aug. 5, 2025

(54) TRANSISTOR ARRANGEMENT WITH A LATERAL SUPERJUNCTION TRANSISTOR DEVICE

(71) Applicant: Infineon Technologies Dresden GmbH & Co. KG, Dresden (DE)

(72) Inventors: Rolf Weis, Dresden (DE); Franz Hirler, Isen (DE); Katarzyna Kowalik-Seidl, Unterhaching (DE); Marco Mueller, Pirna (DE); Anthony Sanders, Weißenfeld (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 461 days.

(21) Appl. No.: 17/745,946

(22) Filed: May 17, 2022

(65) Prior Publication Data
US 2022/0384567 A1 Dec. 1, 2022

(30) Foreign Application Priority Data
May 26, 2021 (EP) .................................... 21176031

(51) Int. Cl.
*H10D 62/10* (2025.01)
*H10D 30/83* (2025.01)
*H10D 62/17* (2025.01)
*H10D 84/84* (2025.01)

(52) U.S. Cl.
CPC ........... *H10D 62/111* (2025.01); *H10D 30/83* (2025.01); *H10D 62/343* (2025.01); *H10D 84/84* (2025.01)

(58) Field of Classification Search
None
See application file for complete search history.

(56) References Cited

U.S. PATENT DOCUMENTS

| | | | |
|---|---|---|---|
| 2017/0092716 A1* | 3/2017 | Mauder | H01L 29/7825 |
| 2017/0222043 A1* | 8/2017 | Hirler | H01L 29/0847 |
| 2019/0198609 A1* | 6/2019 | Weis | H01L 29/7823 |
| 2020/0127087 A1* | 4/2020 | Weis | H01L 29/808 |
| 2020/0185494 A1* | 6/2020 | Weis | H01L 29/78654 |
| 2020/0295202 A1* | 9/2020 | Mahmoud | H01L 29/0607 |
| 2020/0388672 A1* | 12/2020 | Weis | H01L 29/0649 |

* cited by examiner

*Primary Examiner* — Anthony Ho
(74) *Attorney, Agent, or Firm* — Murphy, Bilak & Homiller, PLLC (57) ABSTRACT

A transistor arrangement is disclosed. The transistor arrangement includes a first transistor device and a second transistor device. The first transistor device and the second transistor device are connected in series and integrated in a common semiconductor body. The first transistor device is a lateral superjunction transistor device and is integrated in a first device region of the semiconductor body. The second transistor device is a lateral transistor device and is integrated in at least one second device region of the semiconductor body. The at least one second device region is spaced apart from the first device region.

12 Claims, 6 Drawing Sheets

TRANSISTOR ARRANGEMENT WITH A LATERAL SUPERJUNCTION TRANSISTOR DEVICE

TECHNICAL FIELD

This disclosure in general relates to a transistor arrangement, in particular a transistor arrangement with a lateral superjunction transistor device and a further transistor device.

BACKGROUND

In a transistor arrangement with a lateral superjunction transistor device and a further transistor device the superjunction transistor device may be implemented as depletion device, the further transistor device may be implemented as an enhancement or depletion device and these two transistor devices may be connected such that the further transistor device controls the superjunction transistor device, so that the superjunction transistor device switches on and off controlled by the further transistor device.

SUMMARY

It is desirable in this type of transistor arrangement to design the further transistor device widely independent of the design of the superjunction transistor device.

One example relates to a transistor arrangement. The transistor arrangement includes a first transistor device and a second transistor device, wherein the first transistor device and the second transistor device are connected in series and are integrated in a common semiconductor body, wherein the first transistor device is a lateral superjunction transistor device and is integrated in a first device region of the semiconductor body, wherein the second transistor device is a lateral transistor device and is integrated in at least one second device region of the semiconductor body, and wherein the at least one second device region is spaced apart from the first device region.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
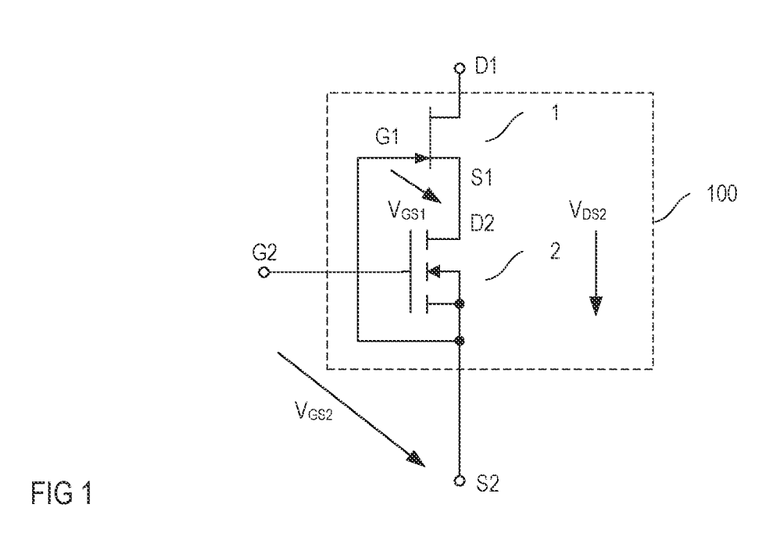
FIG. 1 shows an equivalent circuit diagram of a transistor arrangement that includes a first transistor and a second transistor connected in series and integrated in a common semiconductor body.

FIG. 1 shows an equivalent circuit diagram of a transistor arrangement that includes a first transistor device 1 and a second transistor device 2 that are integrated in a common semiconductor body 100 (which is only schematically illustrated in FIG. 1). Each of the first and second transistor devices 1, 2 includes a gate node G1, G2 and a load path between a drain node D1, D2 and a source node S1, S2, wherein the load paths are connected in series. In the following, the gate, source and drain nodes G1, S1, D1 of the first transistor device 1 are also referred to as first gate, source and drain nodes G1, S1, D1, and the gate, source and drain nodes G2, S2, D2 of the second transistor device 2 are also referred to as second gate, source and drain nodes G2, S2, D2.

According to one example, the first transistor device 1 is a normally-on transistor device and the second transistor devices 2 is a normally-off transistor device, and the first and second transistor devices 1, 2 are connected in such a way that an operating state of the second transistor device 2 governs the operating state of the overall transistor arrangement, so that the transistor arrangement with the two transistors 1, 2 can be operated like one single transistor. This is explained in the following.

For the purpose of explanation, it is assumed that the first transistor device 1 is an n-type JFET and the second transistor device 2 is an n-type enhancement MOSFET, wherein the source node S1 of the first transistor device 1 is connected to the drain node D2 of the second transistor device 2, and the gate node G1 of the first transistor device 1 is connected to the source node S2 of the second transistor device 2. A circuit path between the drain node D1 of the first transistor device 1 and the source node of the second transistor device 2 forms a load path of the transistor arrangement, and the gate node G2 and the source node S2 of the second transistor device 2 form a drive input of the transistor arrangement, so that the transistor arrangement switches on or off dependent on a drive voltage $V_{GS2}$ (gate-source voltage) received at the drive input.

Each of the first transistor device 1 and the second transistor device 2 can be in an on-state or an off-state. The second transistor device 2 is in an on-state (conducting state) when a voltage level of the gate-source voltage $V_{GS2}$ is higher than a predefined threshold voltage level $V_{th2}$. In an n-type enhancement MOSFET (as illustrated in FIG. 1), the threshold voltage level $V_{th1}$ is a positive voltage level. The first transistor device 1 is controlled by a gate-source voltage $V_{GS1}$ received between the first gate node G1 and the first source node S1. An n-type JFET, such as the first transistor device 1 shown in FIG. 1, is in the on-state when a voltage level of the gate-source voltage, such as the gate-source voltage $V_{GS1}$ shown in FIG. 1, is higher than a predefined threshold level $V_{th1}$. That is, the first transistor device 1 is in the on-state, when $V_{GS1} > V_{th1}$, where $V_{th1} < 0$. As the gate node G1 of the first transistor device 1 is connected to the source node S2 of the second transistor device 2, the gate-source voltage $V_{GS1}$ of the first transistor device 1 equals the inverted drain-source voltage $V_{DS2}$ of the second transistor device 2, that is, $V_{GS1} = -V_{DS2}$. The drain-source voltage $V_{DS2}$ of the second transistor device 2 is the voltage between the drain node D2 and the source node S2 of the second transistor device 2.

When a voltage is applied between the first load node D1 and the second load node S2 and when the second transistor device 2 is in the on-state, a magnitude of the drain-source voltage $V_{DS2}$ is very low, so that the gate-source voltage $V_{GS1}$ of the JFET is between the negative threshold level $V_{th1}$ and zero. Thus, the first transistor device 1 is also in the on-state. When the second transistor device 2 switches off, the drain-source voltage $V_{DS2}$ of the second transistor device 2 increases until the inverted drain-source voltage $-V_{DS2}$ reaches the negative threshold voltage $V_{th1}$, so that the first transistor device 1 also switches off.

The second transistor device 2 is designed such that a voltage blocking capability of this second transistor device 2 equals or is higher than a magnitude of the threshold voltage $V_{th1}$ of the first transistor device 1, that is $V_{DS2\_max} \geq |V_{th1}|$, where $V_{DS2\_MAX}$ is the voltage blocking capability of the second transistor device 2. The voltage blocking capability of the second transistor device 2 is the maximum voltage, the second transistor device 2 can withstand between the drain node D2 and the source node S2.

An operation state of the transistor arrangement is defined by an operation state of the second transistor device 2. The transistor arrangement acts like a voltage controlled transistor that switches on or off dependent on a drive voltage $V_{GS2}$ received between the second gate node G2 and the second source node S2.

The first transistor device 1 and the second transistor device are integrated in a common (the same) semiconductor body 100. More specifically, the first transistor device 1 is integrated in a first device region 101 and the second transistor device 2 is integrated in at least one second device region 102 that is spaced apart from the first device region.

Figure 2A:
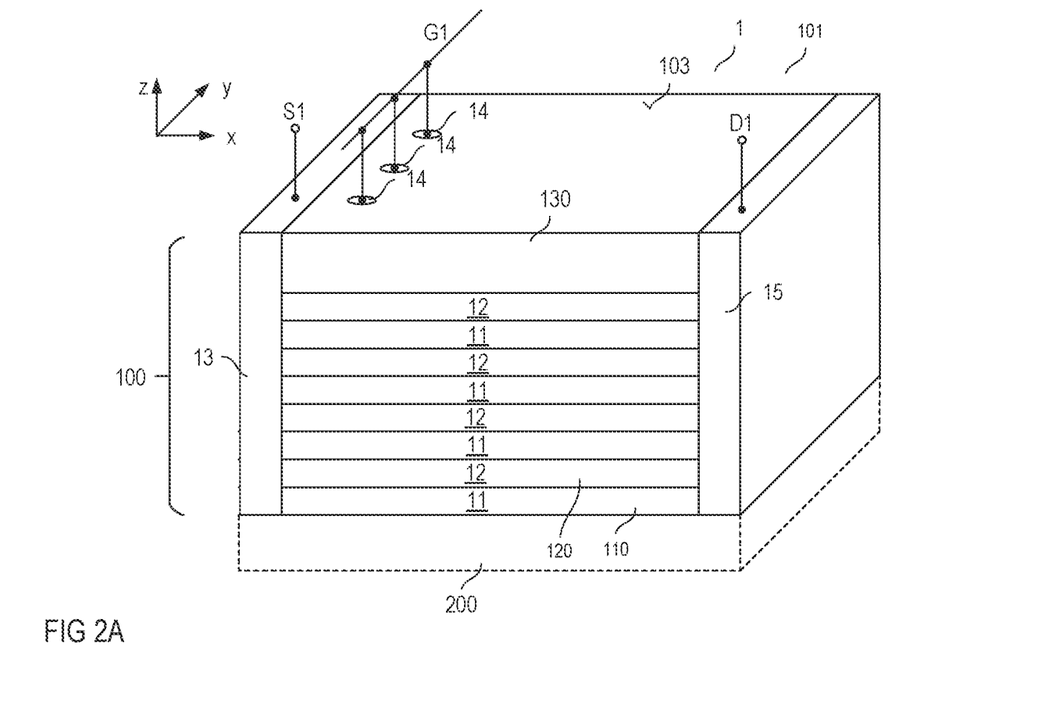
FIGS. 2A-2B schematically illustrate a perspective sectional view (FIG. 2A) and a vertical cross sectional view (FIG. 2B) of the first transistor device according to one example.
Figure 2B:
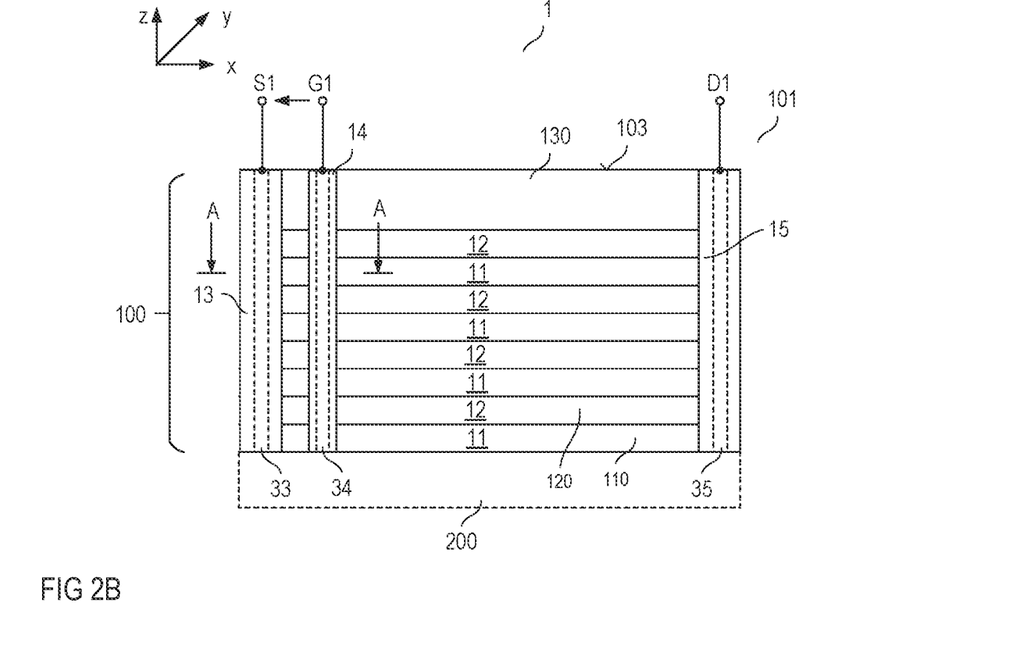

FIGS. 2A and 2B illustrate one example of the first transistor device. More specifically, FIGS. 2A and 2B show a perspective sectional view (FIG. 2A) and a vertical cross sectional view (FIG. 2B) of a first device region 101 of a semiconductor body 100 in which the first transistor device 1 is integrated. The first transistor device 1 is a lateral superjunction transistor device in this example. More specifically, the first transistor device 1 is a lateral superjunction JFET (Junction Field-Effect Transistor).

Referring to FIGS. 2A and 2B, the semiconductor body 100 includes a layer stack with a plurality of first semiconductor layers 110 of a first doping type and a plurality of second semiconductor layers 120 of a second doping type that are arranged alternatingly in a vertical direction z of the semiconductor body 100. The "vertical direction" is a direction perpendicular to a first surface 103 of the semiconductor body 100. The first transistor device 1 includes a source region 13 of a first doping type and a drain region 15 of the first doping type, wherein the drain region 15 is spaced apart from the source region in a first lateral direction x of the semiconductor body 100. In a section of the semiconductor body 100 between the source region 13 and the drain region 15, the first semiconductor layers 110 form drift regions 11 and the second semiconductor layers 120 form compensation regions 12 of the first transistor device 1. Each of the source region 13 and the drain region 15 adjoins the drift regions 11 and may adjoin the compensation regions 12. Furthermore, the first transistor device 1 includes a plurality of gate regions 14 of a second doping type complementary to the first doping type. Each of the plurality of gate regions 14 adjoins at least one of the plurality of compensation regions, is arranged between the first source region 13 and the first drain region 15 in the first direction x, and is spaced apart from the first source region 13 and the first drain region 15. According to one example, each of the plurality of gate regions 14 adjoins each of the plurality of compensation regions 12.

From the layer stack with the first and second semiconductor layers 110, 120 one of these first and second semiconductor layers 110, 120 may adjoin the first surface 103 of the semiconductor body 100. According to another example (as illustrated in FIGS. 2A and 2B), a third semiconductor layer 130 may be arranged between the layer stack with the first and second layers 110, 120 and the first surface 103. The third semiconductor layer is of the second doping type, for example, and may have a doping concentration that is lower than a doping concentration of each of the first and second semiconductor layers 110, 120.

As used herein, a layer or region of the first doping type is a layer or region with an effective doping of the first doping type. Such region or layer of the first doping type, besides dopants of the first doping type, may also include dopants of the second doping type, but the dopants of the first doping type prevail. Equivalently, a layer or region of the second doping type is a layer or region with an effective doping of the second doping type and may contain dopants of the first doping type.

The semiconductor body 100 with the first and second semiconductor layers 110, 120 may include a conventional semiconductor material such as, for example, silicon (Si), silicon carbide (SiC), gallium nitride (GaN), gallium arsenide (GaAs), or the like. The semiconductor body 100 may be arranged on any kind of carrier 200 (illustrated in dashed lines). According to one example, the carrier 200 is a semiconductor substrate and the first and second semiconductor layers 110, 120 are epitaxial layers that have been grown one above the other on the substrate.

According to one example, the overall number of first layers 110 in the layer stack equals the overall number of second layers 120. In the example shown in FIGS. 2A and 2B, an uppermost layer of the layer stack is a second layer 120 and a lowermost layer is a first layer 110. The "uppermost layer" is the layer adjoining the third layer 130, and the lowermost layer is the layer spaced apart from the uppermost layer most distantly. However, implementing the uppermost layer as a second layer 120 and the lowermost layer as a first layer 110 is only an example. According to another example (not shown) the uppermost layer is a first layer and the lowermost layer is a second layer. Just for the purpose of illustration, the layer stack with the first and second layers 110, 120 includes four first layers 110 and four second layers 120, so that the layer stack includes eight layers. This, however, is only an example. According to one example, the overall number of layers 110, 120 in the layer stack is between 4 and 60, in particular between 6 and 30.

The first direction, which is the direction in which the source region 13 and the drain region 15 are spaced apart from each other, is a first lateral direction x of the semiconductor body 100 in the example shown in FIGS. 2A and 2B.

A "lateral direction" of the semiconductor body 100 is a direction parallel to the first surface 103 of the semiconductor body 100. The first and second layers 110, 120 and the third layer 130 are essentially parallel to the first surface 103 in the example shown in FIGS. 2A and 2B. In this example, each of the source region 13 and the drain region 14 extends in a vertical direction z in the semiconductor body 100, and each of the first source region 13 and the first drain region 15 adjoins the third layer 130 and the first layers 110. The "vertical direction" z is a direction perpendicular to the first surface 101. Further, the gate regions 14 extend in the vertical direction z in the semiconductor body 100 so that each of the plurality of gate regions 14 adjoins each of the second semiconductor layers 12. The gate regions 14 are spaced apart from each other in a second lateral direction y. This second lateral direction y is different from the first lateral direction x and may be perpendicular to the first lateral direction x.

The conduction type of the first transistor device 1 is defined by the first doping type. The first transistor device 1 is an n-type JFET when the first doping type is an n-type and the second doping type is a p-type. Equivalently, the first transistor device 1 is a p-type JFET when the first doping type is a p-type and the second doping type is an n-type.

According to one example, the first source region 13, the drain region 15, the plurality of gate regions 14, the first and second layers 110, 120 forming the drift and compensation regions 11, 12, and the third layer 130 are monocrystalline semiconductor regions. According to one example, these regions include monocrystalline silicon (Si) and a doping concentration of the first source region 13 is selected from a range of between 1E17 cm$^{-3}$ (=1·10$^{17}$ cm$^{-3}$) and 1E21 cm$^{-3}$, a doping concentration of the drift regions 11 is selected from a range of between 1E13 cm$^{-3}$ and 5E17 cm$^{-3}$, and a doping concentration of the gate regions 14 is selected from a range of between 1E17 cm$^{-3}$ and 1E21 cm$^{-1}$. The doping concentration of the first drain region 15 can be selected from the same range as the doping concentration of the first source region 13, and the doping concentration of the compensation regions 12 can be selected from the same range as the doping concentration of the drift regions 11.

Referring to FIGS. 2A and 2B, the gate regions 14 of the first transistor device 1 are connected to the first gate node G1, the drain region 15 is connected to the first drain node D1, and the source region 13 is connected to the first source node S1. The first gate node G1, the first drain node D1, and the first source node S1 are only schematically illustrated in FIGS. 1A and 1B. These nodes G1, D1, S1 may include metallizations (not shown) on top of the semiconductor body 100. Optionally, as illustrated in dashed lines in FIG. 2B, a first connection electrode 34 may be embedded in each of the gate regions 14, a second connection electrode 35 may be embedded in the drain region 35, and a third electrode 33 may be embedded in the first source region 13. The first connection electrodes 34 are connected to the gate node G1 and serve to provide a low-ohmic connection between each section of the gate regions 14 and the first gate node G1. The second electrode 35 is connected to the drain node D1 and provides a low-ohmic connection between each section of the drain region 15 and the drain node D1. The third electrode 33 is connected to the source node S1 and provides a low-ohmic connection between each section of the source region 13 and the source node S1. Referring to FIG. 2B, each of the first, second and third connection electrodes 34, 35, 33 may extend along a complete length of the respective semiconductor region 14, 15, 13 in the vertical direction z. Each of these electrodes 34, 35, 33 includes an electrically conducting material. Examples of such electrically conducting material include, but are not restricted to: a metal such as copper (Cu), aluminum (Al), tantalum (Ta), titanium (Ti), cobalt (Co), nickel (Ni) or tungsten (W); a highly doped polycrystalline semiconductor material such as polysilicon; or a metal silicide, such as tungsten silicide (WSi), titanium silicide (TiSi), Cobalt silicide (CoSi), or nickel silicide (NiSi).

Referring to the above, the third semiconductor layer 130 is optional. This third semiconductor layer 130 may be used in the at least one second device region (not shown in FIGS. 2A and 2B) of the semiconductor body 100 to at least partially accommodate the second transistor device 2. In this case, the third semiconductor layer 130 is designed such that it provides sufficient space to integrate active regions of the second semiconductor 2. According to one example, a thickness of the third semiconductor layer 130 is between 1 micrometers (μm) and 7 micrometers, in particular between 3 and 5 micrometers. The "thickness" is the dimension of the third layer 130 in the vertical direction. According to an example, a thickness of the third semiconductor layer is at least twice a thickness of a single first semiconductor layer 110 or a single second semiconductor layer 120. According to one example, a thickness of the third semiconductor layer 130 is at least twice a thickness of each of the first semiconductor layers 110 and the second semiconductor layers 120. The thickness of a single first semiconductor layer 110 or a single second semiconductor layer 120 is, for example, between 100 nanometers (nm) and 3 micrometers (μm). According to another example, a thickness of the third semiconductor layer 130 is greater than a distance between the first source region 13 and each of the gate regions 14.

According to one example, at least a first region 131 of the third semiconductor layer 130, which is a region between the source region 13 and the drain region 15 is a region of the second doping type so that a first p-n junction is formed between the drain region 15 and the first region 131 and a second p-n junction is formed between the source region 13 and the first region 131. These p-n junctions are part of two diodes, a first diode formed by the gate regions 14, the first region 131 and the drain region 15, and a second bipolar diode formed by the gate regions 14, the first region 131 and the source region 13. In each of these diodes, the first region 131 of the third semiconductor layer 130 forms a base region. According to one example, a doping concentration of the first region 131 of the third semiconductor layer 130 is such that a voltage blocking capability of the first diode is equal to or higher than a voltage blocking capability of the first transistor device 1.

The "voltage blocking capability" of the first transistor device 1 is defined by a maximum level of a voltage between the drain node D1 and the gate node G1 the first transistor device 1 can withstand in an off-state. Dependent on the specific design, the voltage blocking capability may range from 20V up to several 100 volts. This voltage blocking capability may be adjusted, inter alia, by suitably selecting a distance between the gate regions 14 and the first drain region 15. In a first transistor device with a voltage blocking capability of 650 volts, for example, the distance may be selected from between 40 micrometers and 60 micrometers and a doping concentration of the first region 131 may be selected from a range of between 1E13 cm$^{-3}$ and 1E15 cm$^{-3}$, in particular from between 1.1 E14 cm$^{-3}$ and 4.6E14 cm$^{-3}$.

The function of the first transistor device 1 shown in FIGS. 2A and 2B is as follows. Referring to FIGS. 2A and 2B, in the on-state of the first transistor device 1 and the second transistor device 2 (not shown in FIGS. 2A and 2B), a current can flow from the first drain node D1 via the drain region 15, the drift regions 11, the first source region 13, and the drain-source path D2-S2 of the second transistor device 2 to the second source node S2. When the second transistor device 2 switches off, the electrical potential at the first drain node D1 can increase relative to the electrical potential at the second source node S2. This increase of the electrical potential at the first drain node D1 causes an increase of the electrical potential at the first source region 13, while the electrical potential at the gate regions 14 is tied to the electrical potential at the second source node S2. The increase of the electrical potential of the first source region 13 and the drift regions 11 causes p-n junctions between the first source region 13 and the compensation regions 12 and between the gate regions 14 and the drift regions 11 to be reverse biased. Furthermore, p-n junctions between the drift regions 11 and the compensation regions 21 are reverse biased. Reverse biasing those p-n junctions causes the drift regions 11 to be depleted of charge carriers. The first transistor device 1 switches off as soon as the drift regions 11 between the at least two gate regions 14 and/or between the gate regions 14 and the first source region 13 has been completely depleted of charge carriers.

According to one example, the first and second layers 110, 120 are implemented such that the drift regions 11 and the compensation regions 12 are essentially balanced with regard to their dopant doses. That is, at each position in the current flow direction of the first transistor device, the amount of dopant atoms (dopant charges) in one drift region 11 essentially corresponds to the amount of dopant atoms in the neighboring compensation region 12. "Essentially" means that there may be an imbalance of up to +/−10%. That is, there may be 10% more or less dopant atoms in the drift regions 11 than in the compensation regions 12. Thus, when the first transistor device is in the off-state and depletion regions (space charge regions) expand in the drift and compensation regions 11, 12 essentially each doping atom in each drift region 11 has a corresponding doping atom (which may be referred to as counter doping atom) of a complementary doping in the compensation regions 12 and the drift and compensation regions 11, 12 can completely be depleted. As commonly known, compensation regions in a superjunction transistor device, such as first transistor device 1 shown in FIGS. 2A and 2B, make it possible to implement the drift regions with a higher doping concentration than in a conventional, non-superjunction device. This reduces the on-resistance, which is the electrical resistance in the on-state, without decreasing the voltage blocking capability.

Figure 3A:
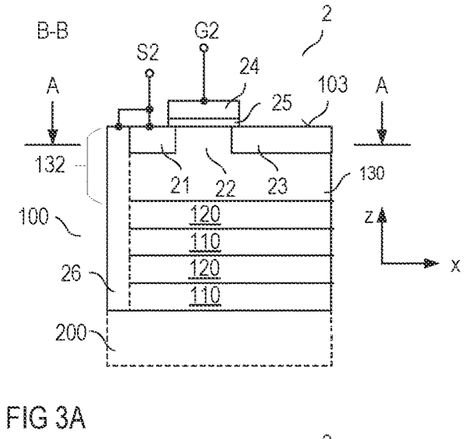
FIGS. 3A-3B schematically illustrate a vertical sectional view (FIG. 3A) and a top view (FIG. 3B) of the second transistor device according to one example.
Figure 3B:
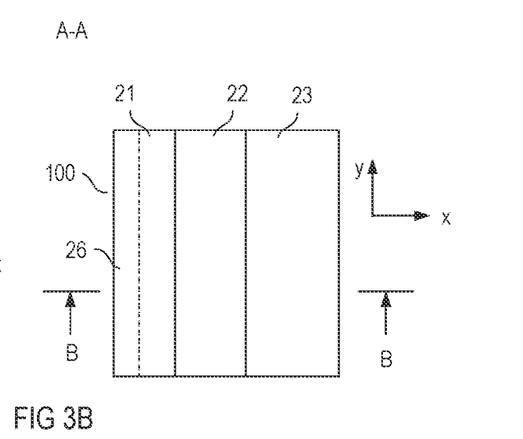

The second transistor device 2 may be implemented in various ways. Some examples for implementing the second transistor 2 are explained with reference to FIGS. 3A-3B, 4, 5 and 6A-6B below. FIGS. 3A and 3B show a first example of the second transistor device 2, wherein FIG. 3A shows a vertical cross sectional view and FIG. 3B shows a horizontal cross sectional view of the second transistor device 2. Referring to FIG. 3A, the second transistor device 2 includes a source region 21 and a drain region 23 spaced apart from the source region 21 in the first lateral direction x. The drain region 23 is connected to the source region 13 of the first transistor device (not shown in FIGS. 3A-3B) in a way explained in further detail herein below. The source region 21 and the second drain region 23 of the second transistor device 2 are separated by a body region 22. The body region 22 has a doping type that is complementary to the doping type of the second source region 21 and the second drain region 23. A doping concentration of the body region 22 is, for example, selected from a range of between 1E16 cm$^{-3}$ and 1E19 cm$^{-3}$, in particular from between 1E17 cm$^{-3}$ and 1E18 cm$^{-3}$.

Referring to FIG. 3A, a gate electrode 24 is adjacent the body region 22 and dielectrically insulated from the body region 22 by a gate dielectric 25. This gate electrode 24 is electrically connected to the second gate node G2. The source region 21 is electrically connected to the second source node S2.

The second transistor device 2 may be implemented as an enhancement device (normally-off device) or a depletion (normally on-device). In a normally-off device, the body region 22 adjoins the gate dielectric 25 (and the gate electrode 24, in the on-state of the second transistor device 2, generates an inversion channel in the body region 22 along the gate dielectric 25), In a normally-on device, a channel region (not shown) of the first doping is arranged between the body region 22 and the gate dielectric 25 and extends from the second source region 21 to the second drain region 23 (and the gate electrode 24, in the off-state of the second transistor device 2, depletes the channel region of charge carriers).

According to one example, the second transistor device 2 is an n-type transistor device. In this case, each of the source region 21 and the drain region 23 is n-doped, while the body region 22 is p-doped. According to another example, the second transistor device 2 is a p-type transistor device. In this case, each of the source region 21 and the drain region 23 is p-doped, while the body region 22 is an n-doped semiconductor region. The second transistor device 2 shown in FIG. 3A is an enhancement transistor device. In this transistor device, the body region 22 adjoins the gate dielectric 25. According to another example (not shown), the second transistor device 2 is a depletion transistor device. In this case, the transistor device 2 includes a channel region of the same doping type as the source region 21 and the drain region 23, wherein the channel region is arranged between the body region 22 and the gate dielectric 25 and extends from the source region 21 to the drain region 23.

Referring to FIG. 3B, which shows a horizontal cross sectional of the second transistor device 2, the source region 21, the drain region 23, and the body region 22 may be elongated in the second lateral direction y of the semiconductor body 100.

Referring to FIG. 3A, the active device regions of the second transistor device 2, that is, the source, body and drain regions 21, 22, 23 may be arranged in the third semiconductor layer 130. A region 132 of the third layer 130 in which the active device regions of the second transistor device 2 are integrated is referred to as second region 132 of the third layer 130 in the following.

Referring to FIGS. 3A and 3B, a connection region 26 of the second doping type may be connected to the second source node S2 and extend through the third layer 130 and the layer stack with the first and second layers 110, 120. This connection region 26 connects those sections of the second layers 120 that are arranged below the second region 132 to the second source node S2. Referring to the above, the first layers 110 are connected to the first source node S1 and, as the first source node S1 is connected to the second drain node D2, to the drain region 23 of the second transistor device 2. Because of the fact that, below the second region 132, the second layers 120 are connected to the second source node S2 and that the first layers 110 are connected to the second drain node D2 a depletion region can expand in the first and second layer sections 110, 120 below the second region 132 when the second transistor device 2 is in the off-state.

Figure 4:
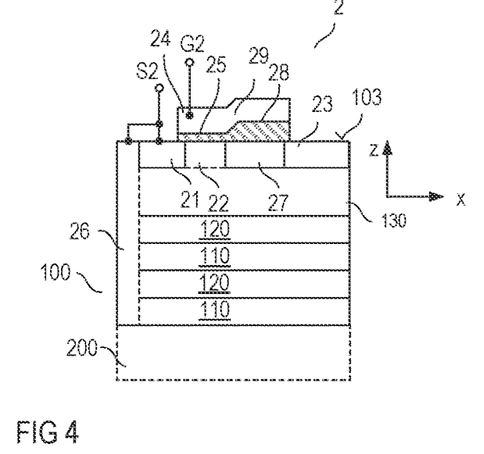
FIGS. 4-5 illustrate vertical sectional views of the second transistor device according to further examples.

FIG. 4 shows a modification of the transistor device shown in FIGS. 3A and 3B. In this modification, the transistor device 2 includes a drift region 27 (which may also be referred to as drain extension) between the body region 22 and the drain region 23. The drift region 27 has a lower doping concentration than the drain region 23 and the same doping type as the drain region 23. A field electrode 29 is adjacent the drift region 27 and dielectrically insulated from the drift region 27 by a field electrode dielectric 28. According to one example, the field electrode dielectric 28 is thicker than the gate dielectric 25. As illustrated, the field electrode 29 may be electrically connected to the gate electrode 24, for example, by forming the gate electrode 24 and the field electrode as one conductive layer. According to another example (not shown), the field electrode 29 is electrically connected to the second source node S2 and electrically insulated from the gate electrode 24.

Figure 5:
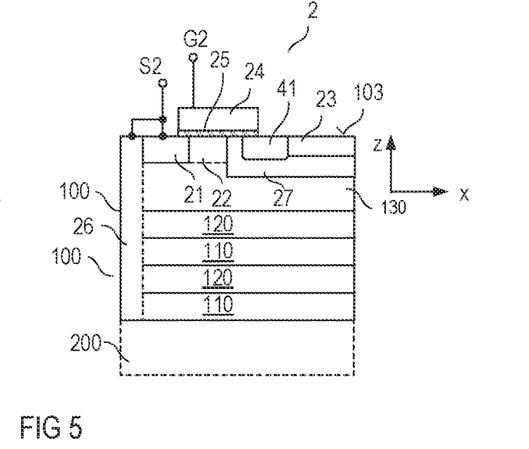

FIG. 5 shows another modification of the transistor device shown in FIGS. 3A-3B. In the example shown in FIG. 5, the gate electrode 24 and the gate dielectric 25 overlap the drift region 27, but, in the first lateral direction x, do not extend to the drain region 23. An insulation region 41 is arranged between the drift region 27 and those regions of the first surface 103 that are not covered by the gate electrode 24 and the gate dielectric 25. This insulation region 41 may adjoin the drain region 23, as shown in FIG. 5. In this example, the drift region 27 adjoins the drain region 23 in a region spaced apart from the first surface 101. The insulation region 41 may include a conventional electrically insulating material such as an oxide. The insulation region 41 may be implemented as a so called STI (Shallow Trench Isolation) and include a thermally grown oxide.

Figure 6A:
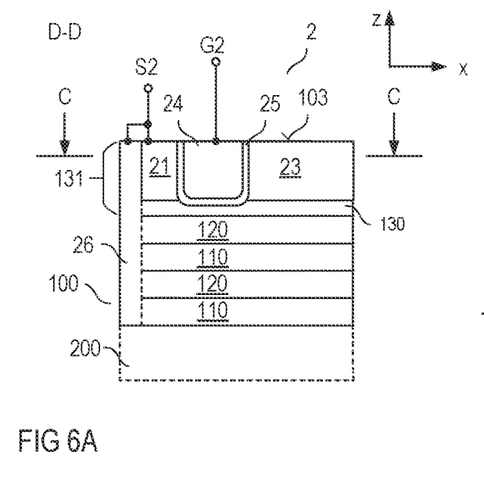
FIGS. 6A-6B schematically illustrate a vertical sectional view (FIG. 6A) and a top view (FIG. 6B) of the second transistor device according to another example.
Figure 6B:
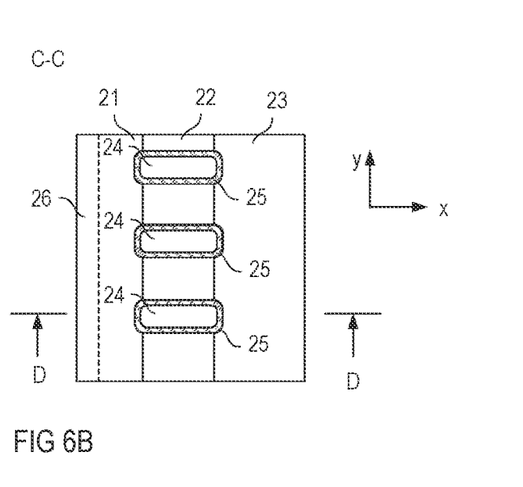

In the example shown in FIGS. 3A, 4, and 5, the gate electrode 24 is arranged on top of the first surface 101 of the semiconductor body. This, however, is only an example. According to another example shown in FIGS. 6A-6B, there are several gate electrodes 24 that are arranged in trenches extending from the first surface 101 into the semiconductor body 100. Each of these gate electrodes, in the first lateral direction x, extends from the source region 21 to the drain region 23 through the body region 22 and is dielectrically insulated from these semiconductor regions 21, 22, 23 by a gate dielectric 25. Each of these gate electrodes 24 is electrically connected to the second gate node G2, which is schematically illustrated in FIG. 6A.

Second transistor devices of the type shown in FIGS. 3A-3B, 4, 5 and 6A-6B can be implemented using conventional implantation and oxidation processes known from integrated CMOS (Complementary Metal Oxide Semiconductor) processes. The second transistor device 2. Before forming the active regions (source, body and drain regions 21, 22, 23) of the second transistor device 2 in the second region 132 of the third semiconductor layer 130, the second region 132 may have a basic doping of the second doping type or may be intrinsic. According to one example, the basic doping concentration is selected such that it essentially equals the doping concentration of the body region 22 or is lower than the doping concentration of the body region 22.

Referring to the above, the first transistor device 1 and the second transistor device 2 are integrated in a common semiconductor body 100, wherein the first transistor device 1 is integrated in a first device region of the semiconductor body, and the second transistor device 2 is integrated in at least one second device region of the semiconductor body. One example, for implementing the first and second transistor devices 1, 2 in this way is illustrated in FIG. 7.

Figure 7:
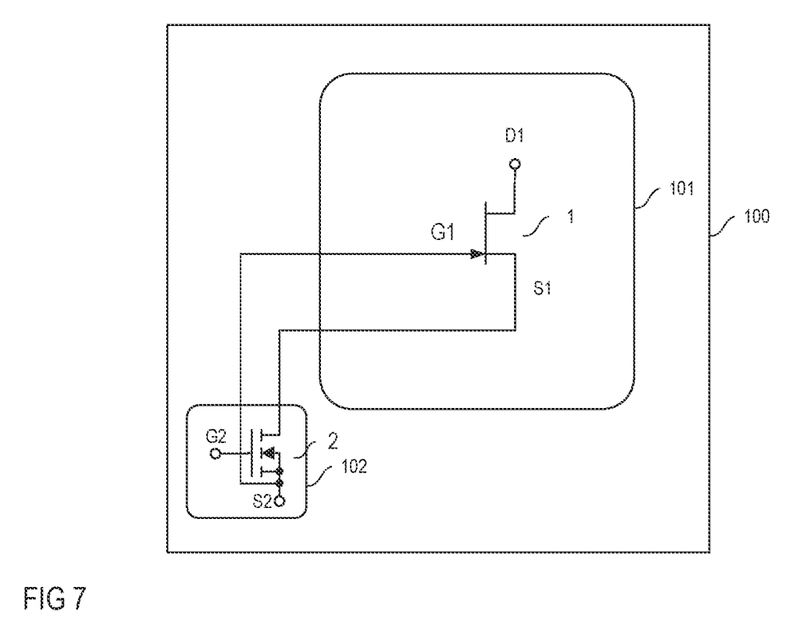
FIG. 7 illustrates a top view of a semiconductor body with a first device region and one second device region.

FIG. 7 illustrates a top view of the semiconductor body 100. The semiconductor body 100 includes the first device region 101 and one second device region 102, wherein the second device region 102 is spaced apart from the first device region 101. The first transistor device 1 is integrated in the first device region 101, and the second transistor device 2 is integrated in the second device region 102, wherein the first and second transistor devices 1, 2 are only schematically illustrated in FIG. 7 using the respective circuit symbol.

The first transistor device 1 and the second transistor device 2 are connected in series as explained herein above. Electrical connections between the first transistor device 1 and the second transistor device 2 may include metallizations on top of the semiconductor body 100. This is explained in detail herein further below.

Figure 8:
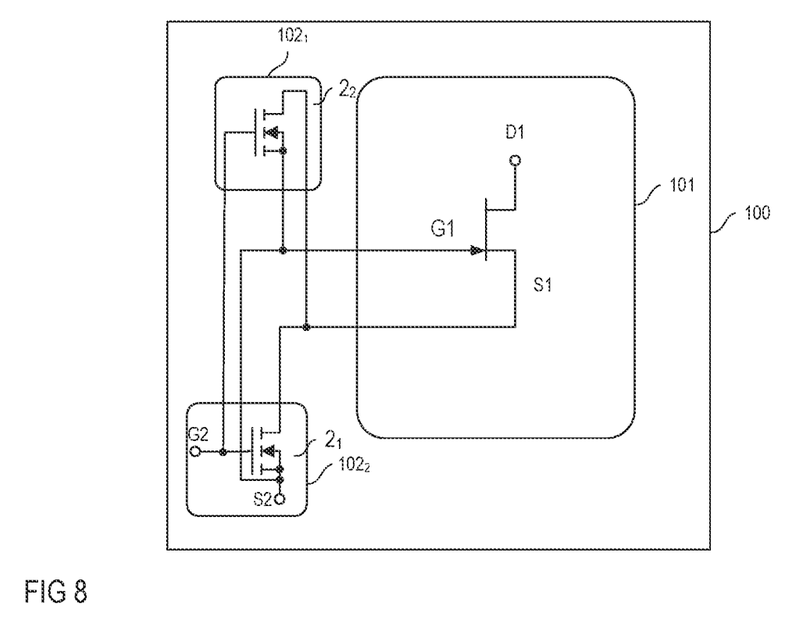
FIG. 8 illustrates a top view of a semiconductor body with a first device region and two second device regions.

Referring to FIG. 8, the second transistor device may include two or more partial transistors $2_1$, $2_2$ which are connected in parallel. In this case, the semiconductor body 100 includes a corresponding number of second device regions $102_1$, $102_2$, wherein each of the partial transistors $2_1$, $2_2$ is integrated in a respective one of the two or more second device regions 102. These second device regions $102_1$, $102_2$ are spaced apart from each other and are spaced apart from the first device region 101. "Connected in parallel" means that gate electrodes of the two or more partial transistors $2_1$, $2_2$ are connected to the gate node G2, source regions of the two or more partial transistors $2_1$, $2_2$ are connected to the source node S2, and drain regions of the two or more partial transistors $2_1$, $2_2$ are connected to the drain node D2 of the second transistor device 2. Each of the two or more partial transistors $2_1$, $2_2$ may be implemented in accordance with any one of the examples illustrated in FIG. 3A-3B, 4, 5, or 6A-6B.

Referring to the above, electrical connections between the first transistor device 1 and the second transistor device 2 may be implemented using metallizations on top of the first surface 103 of the semiconductor body 100. This is schematically illustrated in FIG. 9.

Figure 9:
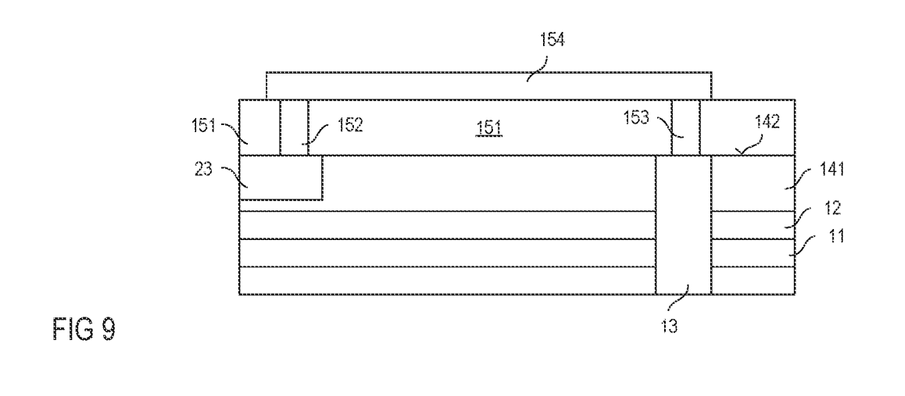
FIG. 9 illustrates one example of an electrical connector for connecting the first transistor device and the second transistor device.

FIG. 9 shows a vertical cross sectional view of one section of the semiconductor body 100 in which the drain region 23 of the second transistor device 2 and the source region 13 of the first transistor device 1 are located. It should be noted, that the drain region 23 illustrated in FIG. 9 may be the drain region of the second transistor device 2 or may be the drain region of a partial transistor, such as one of partial transistors $2_1$, $2_2$ shown in FIG. 8, of the second transistor device 2. The drain region 23 of the second transistor device 2 and the source region 13 of the first transistor device 1 are electrically connected by a metallization 154 is arranged on top of an insulating layer 151 and by electrically conducting vias 152, 153. Each of these vias 152, 153 extends through the insulating layer 151 and connects a respective one of the drain region 23 and the source region 13 to the electrically conducting layer 154.

Figure 10:
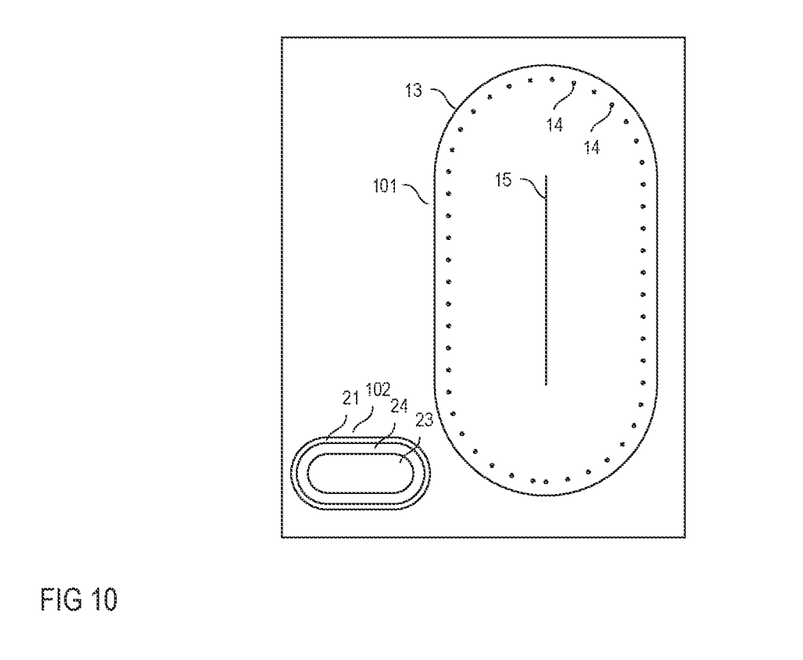
FIG. 10 illustrates, in greater detail, a top view of the semiconductor body according to one example.

FIG. 10 shows a top view of the semiconductor body 100 and illustrates one example for integrating the first transistor device 1 and the second transistor device 2 in the semiconductor body 100 in greater detail. In this example, the source region 13 of the first transistor device forms a closed loop in a horizontal plane of the semiconductor body. The drain region 15 is spaced apart from the source region 13 and is arranged inside the closed loop formed by the source region 13. The gate regions 14 are arranged inside the closed loop formed by the source region 13, spaced apart from each other and spaced apart from each of the source regions 13 and the drain region 15.

In the example shown in FIG. 10, the second transistor device 2 is implemented in a similar way as the first transistor device 1. That is, the source region 21 of the second transistor device forms a closed loop, wherein the drain region 23 is located inside the closed loop formed by the source region 21 and spaced apart from the source region 21. The at least one gate electrode 24 and the body region (which is out of view in FIG. 10) are arranged inside the closed loop formed by the source region 21 and between the source region 21 and the drain region 23. Just for the purpose of illustration, the gate electrode 24 according to FIG. 10 is drawn to form a closed loop and may be implemented as illustrated in one of FIGS. 3A, 4 and 5. This, however, is only an example. Instead of one gate electrode 24 a plurality of gate electrodes 24 of the type shown in FIGS. 6A and 6B may be used as well.

In the example shown in FIG. 10, the first device region 101 is the region of the semiconductor body 100 that includes the source region 13 of the first transistor device 1 and the regions inside the closed loop formed by the source region 13. The source region 13 can be considered to form a border of the first device region 101. Equivalently, the second device region 102 is the region of the semiconductor body 100 that includes the source region 21 of the second transistor device 2 and the regions inside the closed loop formed by the source region 21. The source region 21 can be considered to form a border of the second device region 102.

In the example shown in FIG. 10, the closed loop formed by the source region 13 of the first transistor device 1 has the shape of a rectangle with rounded corners. This, however, is only an example.

Figure 11:
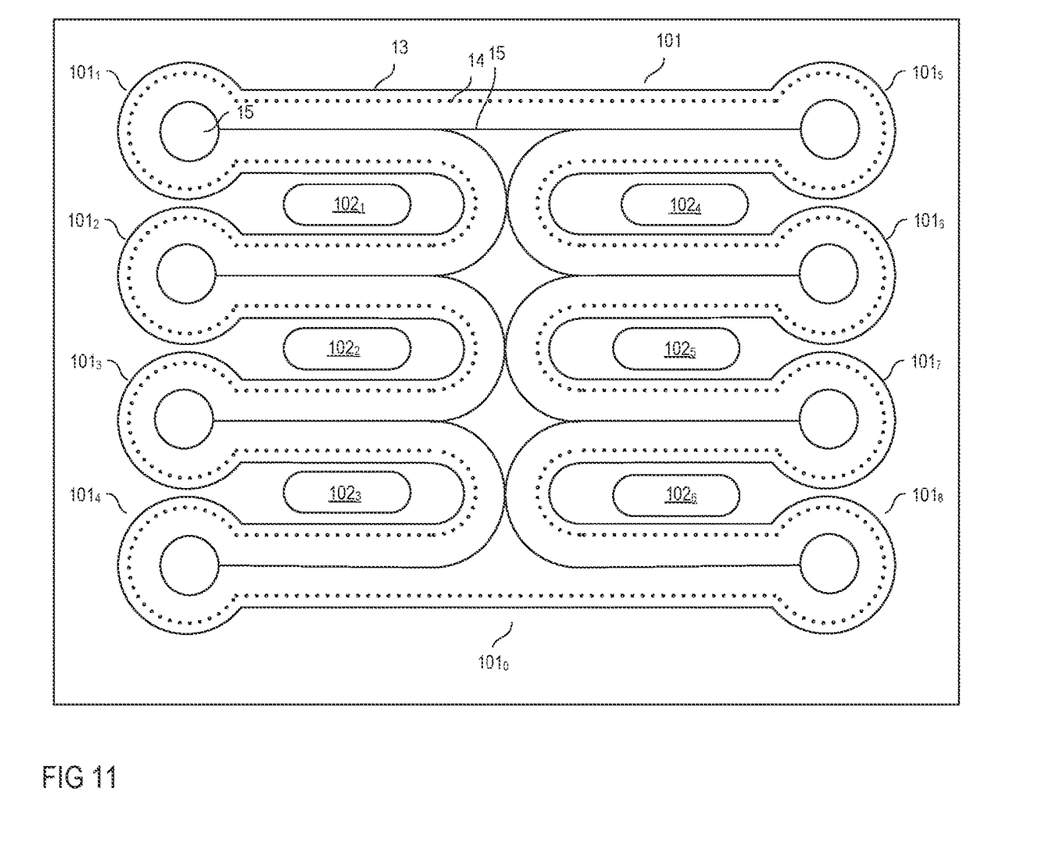
FIG. 11 illustrates, in greater detail, a top view of the semiconductor body according to another example.

FIG. 11 shows another example of a first transistor device 1 in which the source region 13 forms a closed loop around the gate regions 14 and the drain region 15 of the first transistor device 1, so that a border of the first device region 101 is defined by the source region 13. In this example, the first device region 101, includes an elongated central portion $101_0$ and several "arms" $101_1$-$101_8$ each extending outwardly from the central portion $101_0$.

The drain region 15 is arranged inside the closed loop formed by the source region 13 and spaced apart from the source region 13. According to one example, a geometry of the drain region 15 is adapted to the geometry of the source region 13 such that a shortest distance between the source region 13 and the drain region 15 is essentially the same at each position of the first device region 101. Furthermore, the gate regions 14 are arranged inside the closed loop formed by the source region 13 and spaced apart from the source region 13 and the drain region 15. According to one example, the gate regions 14 are arranged such that a shortest distance between the drain region 15 and a respective gate region 14 is essentially the same at each position of the first device region 101. In this way, the voltage blocking capability of the first transistor device 1 is essentially the same at each position.

Referring to FIG. 11, the arms $101_1$-$101_8$ of the first device region 101 define spaces therebetween, wherein the second device region 102 is arranged in these spaces. The "!second device region 102 being is arranged in these spaces" includes that either (a) the second device region 102 is arranged in one of these spaces; or (b) the second device region 102 includes several partial device regions $102_1$-$102_6$ (as illustrated) and each of these partial device regions $102_1$-$102_6$ is arranged in a respective space between two neighboring ones of the arms $101_1$-$101_8$. Neighboring arms $101_1$-$101_8$ of the first device region 101 may completely be spaced apart from each other (as illustrated). This, however, is only an example. Referring to FIG. 11, the arms $101_1$-$101_8$ may widen up towards a peripheral end, which is an end spaced apart from the central portion $101_0$. In this case, neighboring arms $101_1$-$101_8$ may be implemented such that they adjoin each other in the region of their respective peripheral end.

It be should be noted, that the widening of the arms $101_1$-$101_8$ towards the peripheral ends may be necessary to ensure a certain voltage blocking capability of the first transistor device 1 also in the region of these peripheral ends. This widening of the arms $101_1$-$101_8$ towards the peripheral ends results in spaces between neighboring arms $101_1$-$101_8$ in regions between the central portion $101_0$ and the peripheral ends. Arranging the second device region 102 in at least one of these spaces has the effect that the first transistor device 1 and the second transistor device 2 are implemented in a very space efficient way.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor arrangement, comprising:
  a first transistor device; and
  a second transistor device,
    wherein the first transistor device and the second transistor device are connected in series and integrated in a common semiconductor body,
    wherein the first transistor device is a lateral superjunction transistor device and is integrated in a first device region of the semiconductor body,
    wherein the second transistor device is a lateral transistor device and is integrated in at least one second device region of the semiconductor body,
    wherein the at least one second device region is spaced apart from the first device region.

2. The transistor arrangement of claim 1,
    wherein each of the first transistor device and the second transistor device comprises a gate node, a source node, and a drain node,
    wherein the gate node of the first transistor device is connected to the source node of the second transistor device, and
    wherein the source node of the first transistor device is connected to the drain node of the second transistor device.

3. The transistor arrangement of claim 1,
    wherein the second transistor device is integrated in a plurality of second device regions that are spaced apart from each other and that are each spaced apart from the first device region.

4. The transistor arrangement of claim 1, wherein the first transistor device comprises:
   a source region and a drain region that are laterally spaced apart from each other in the first device region;
   a plurality of drift regions of a first doping type and a plurality of compensation regions of a second doping type complementary to the first doping type, wherein the drift regions and the compensation regions are arranged alternatingly in a vertical direction of the semiconductor body, and wherein the drift regions and the compensation regions each extend from the source region to the drain region; and
   a plurality of gate regions that are arranged between the source region and the drain region, that are spaced apart from each other, and that each extend into the plurality of drift regions and the plurality of compensation regions.

5. The transistor arrangement of claim 4,
   wherein the semiconductor body includes a layer stack with a plurality of first layers of the first doping type and a plurality of second layers of the second doping type,
   wherein the first layers and the second layers are arranged alternatingly in the vertical direction of the semiconductor body, and
   wherein, in the first device region, the first layers form the drift regions and the second layers form the compensation regions.

6. The transistor arrangement of claim 1, wherein the second transistor device comprises:
   a source region and a drain region that are laterally spaced apart from each other in the at least one second device region;
   a body region adjoining the source region; and
   at least one gate electrode dielectrically insulated from the body region by a gate dielectric.

7. The transistor arrangement of claim 6,
   wherein the at least one gate electrode is arranged above a first surface of the semiconductor body.

8. The transistor arrangement of claim 6,
   wherein the at least one gate electrode is arranged in a trench extending into the semiconductor body.

9. The transistor arrangement of claim 6,
   wherein the transistor arrangement comprises a plurality of second device regions,
   wherein the second transistor device comprises a plurality of transistor cells,
   wherein each of the plurality of transistor cells is integrated in a respective one of the plurality of second device regions, and
   wherein each of the plurality of transistor cells has at least one gate electrode connected to a gate node of the second transistor device, a source region connected to a source node of the second transistor device, and a drain region connected to a drain node of the second transistor device.

10. The transistor arrangement of claim 1, further comprising an electrical conductor connecting between the first transistor device and the second transistor device to connect the first transistor device and the second transistor device in series.

11. The transistor arrangement of claim 10,
    wherein the electrical conductor is arranged on top of an insulation layer,
    wherein the insulation layer is arranged on top of a first surface of the semiconductor body, and
    wherein the electrical conductor is electrically connected to a source region of the first transistor device and a drain region of at least one transistor cell of the second transistor device.

12. The transistor arrangement of claim 1,
    wherein the first device region comprises a plurality of arms defining spaces therebetween, and
    wherein the at least one second device region is arranged in at least one of the arms.

* * * * *